(12) United States Patent
Su (10) Patent No.: US 10,159,141 B2
(45) Date of Patent: Dec. 18, 2018

(54) FREE GROUNDING FILM AND MANUFACTURING METHOD THEREFOR, AND SHIELDING CIRCUIT BOARD INCLUDING FREE GROUNDING FILM AND GROUNDING METHOD

(71) Applicant: GUANGZHOU FANG BANG ELECTRONICS CO., LTD., Guangzhou (CN)

(72) Inventor: Zhi Su, Guangzhou (CN)

(73) Assignee: GUANGZHOU FANG BANG ELECTRONICS CO., LTD., Guangzhou (CN)

( * ) Notice: Subject to any disclaimer, the term of this patent is extended or adjusted under 35 U.S.C. 154(b) by 22 days.

(21) Appl. No.: 15/517,437

(22) PCT Filed: Dec. 19, 2014

(86) PCT No.: PCT/CN2014/094378
§ 371 (c)(1),
(2) Date: May 19, 2017

(87) PCT Pub. No.: WO2016/054864
PCT Pub. Date: Apr. 14, 2016

(65) Prior Publication Data
US 2017/0251550 A1    Aug. 31, 2017

(30) Foreign Application Priority Data
Oct. 8, 2014  (CN) .......................... 2014 1 0524160

(51) Int. Cl.
*B32B 7/12* (2006.01)
*H05K 1/02* (2006.01)
(Continued)

(52) U.S. Cl.
CPC ............. *H05K 1/0218* (2013.01); *B32B 7/12* (2013.01); *B32B 37/12* (2013.01); *H01B 1/023* (2013.01);
(Continued)

(58) Field of Classification Search
CPC ........ B32B 7/12; B32B 37/12; H05K 1/0218; H05K 9/0081; H01B 1/023; H01B 1/026
See application file for complete search history.

(56) References Cited

U.S. PATENT DOCUMENTS 9,271,392 B2 * 2/2016 Lin ...................... H05K 1/0245
9,609,792 B2    3/2017 Su

FOREIGN PATENT DOCUMENTS

CN    102026529 A    4/2011
CN    102572025 A    7/2012
(Continued)

OTHER PUBLICATIONS

International Search Report for counterpart PCT Application No. PCT/CN2014/094378, dated Jul. 3, 2015 (6 pgs.).
(Continued)

*Primary Examiner* — Elizabeth E Mulvaney
(74) *Attorney, Agent, or Firm* — Shumaker & Sieffert, P.A.

(57) ABSTRACT

A free grounding film and a manufacturing method therefor, and a shielding circuit board including the free grounding film and a grounding method. The free grounding film includes at least one conductor layer. The shielding circuit board including the free grounding film is formed in a manner that an electromagnetic wave shielding film is arranged on a printed circuit board, and the upper surface of the electromagnetic wave shielding film is provided with the free grounding film. The grounding method for the shielding circuit board adopts one of three modes.

8 Claims, 5 Drawing Sheets

(51) Int. Cl.
*B32B 37/12* (2006.01)
*H01B 1/02* (2006.01)
*H05K 9/00* (2006.01)

(52) U.S. Cl.
CPC .......... *H01B 1/026* (2013.01); *H05K 9/0081* (2013.01); *H05K 9/0084* (2013.01); *B32B 2307/202* (2013.01); *B32B 2307/212* (2013.01); *B32B 2457/08* (2013.01); *H05K 1/0216* (2013.01); *H05K 2201/0355* (2013.01); *H05K 2201/0715* (2013.01)

(56) References Cited

FOREIGN PATENT DOCUMENTS

| CN | 103763893 | A | | 4/2014 |
|---|---|---|---|---|
| CN | 203859981 | U | | 10/2014 |
| CN | 203859982 | U | | 10/2014 |
| CN | 204305452 | U | | 4/2015 |
| JP | 53141470 | | * | 12/1978 |
| JP | 2003243785 | A | | 8/2003 |
| JP | 2004221564 | A | | 8/2004 |

OTHER PUBLICATIONS

Search Report for corresponding CN Application No. 2014105241606, 2 pgs.
Supplemental Search Report for corresponding CN Application No. 2014105241606, 2 pgs.
Second Supplemental Search Report for corresponding CN Application No. 2014105241606, 1 pg.

* cited by examiner

FREE GROUNDING FILM AND MANUFACTURING METHOD THEREFOR, AND SHIELDING CIRCUIT BOARD INCLUDING FREE GROUNDING FILM AND GROUNDING METHOD

This application is a U.S. national phase application under 37 U.S.C. § 371 of International Application No. PCT/CN2014/094378 filed on Dec. 19, 2014, which claims priority to CN Application No. 201410524160.6 filed Oct. 8, 2014. The entire contents of each of PCT/CN2014/094378 and CN Application No. 201410524160.6 are incorporated herein by reference.

TECHNICAL FIELD

The embodiments of the disclosure relate to a free grounding film and a manufacturing method therefor, and a shielding circuit board including a free grounding film and a grounding method.

BACKGROUND

A Flexible Printed Circuit (FPC), as a special base material that connects electronic components, has excellent performances such as being light, thin, diverse in structure, and bend-resistant. It can be widely used in folding mobile phones, liquid crystal displays, notebook computers, tape-carrier IC packaging substrate and other high-end areas.

In recent years, with the rapid development of the electronics industry, electronic products further develop towards miniaturization, lightweight, and high-density assembly. Driven by the high-frequency trend of communication systems, the third generation of mobile phones has entered the market in a large amount. In addition, the integration of mobile phones will also promote mobile phone components to have a high frequency and a high speed rapidly. The high-frequency trend of mobile phone key components is bound to be unavoidable. The electromagnetic interference problem inside and outside components resulted from being driven by the high-frequency and high-speed trend will gradually become serious. Therefore, an important indicator of a functional flexible circuit board is electromagnetic shielding (EMI shielding). A shielding film has become essential auxiliary material of a circuit board.

In the circuit board industry, an electromagnetic shielding film is affixed after a covering film on the circuit board opens a window, the noise generated by the signal line is conducted into the circuit board stratum through the shielding film, and the electromagnetic interference inside and outside shielding components is achieved. This using method requires the design of a grounded PAD on the circuit board, a window must be opened in the covering film, and the amount of adhesive overflow of the covering film should be strictly controlled. The complexity of the circuit board processing technology will be increased, while the size of the grounded PAD will affect the shielding effect. The biggest drawback is that the grounded PAD must be designed, so the space of the circuit board cannot be fully utilized.

The Chinese Patent CN102026529 A, entitled as Shielding Film, Shielding Circuit Board Having The Same, And Method Of Grounding Shielding Film, discloses a conductive member including a metal layer connected to an external grounding member in the state of contact and a conductive grounding layer including conductive particles, wherein the grounding is formed in such manner that the conductive particle pierces the insulating covering film layer of the shielding film connected thereto and is finally connected to the stratum. Although this method can achieve free grounding of the shielding film and overcome the above technical difficulties, the size of the conductive particle is relatively high, and the cost is higher. Particles with a special shape and a larger diameter are needed to pierce the insulating covering film layer of the shielding film, while the particle size distribution of conductive particles should be relatively uniform. If there are conductive particles whose particle size is lower than the average particle size, there will be insulating covering film layer of the shielding film that cannot be pierced locally, thus affecting the grounding.

SUMMARY

It is an object of the embodiments of the disclosure to provide a free grounding film and a manufacturing method therefor, and a shielding circuit board including a free grounding film and a grounding method.

The technical solution adopted by the embodiments of the disclosure is as follows.

A free grounding film includes at least one conductor layer.

One side of the conductor layer is an adhesive film layer and the other side is a peelable carrier film.

The surface of the conductor layer is flat, the total thickness of the conductor layer is valued from 0.01 to 35 µm, and the adhesive film layer is a layer made of a mixture of a conductive particle and an adhesive and having a thickness of 0.2-20 µm, in the adhesive film layer, the volume ratio of the conductive particle to the adhesive is valued from 2% to 80%, and the particle size of the conductive particle is valued from 0.1 to 15 µm, or at least on the conductor layer adjacent to the adhesive film layer, the surface of the conductor layer in contact with the adhesive film layer is rough, the roughness is valued from 0.3 to 10 µm, the total thickness of the conductor layer is valued from 0.01 to 35 µm, the adhesive film layer is a layer made of an adhesive and having a thickness of 0.2-10 µm or a layer made of a mixture of an adhesive and a conductive particle and having a thickness of 0.2-20 µm, in the layer made of the mixture of an adhesive and a conductive particle, the volume ratio of the conductive particle to the adhesive is valued from 2% to 80%, and the particle size of the conductive particle is valued from 0.1 to 15 µm.

The material of the conductor layer is at least one of metal material, ferrite, graphite, carbon nanotube and graphene, the metal material is at least one of aluminum, titanium, zinc, iron, nickel, chromium, cobalt, copper, silver, gold and molybdenum, or an alloy formed by at least two of the above listed metal elements; and the adhesive is at least one of a modified epoxy resin, modified acrylic acid, modified rubber, modified thermoplastic polyimide, and a modified polyurethane resin.

The peelable carrier film is a peelable metal foil carrier tape or is a polyester carrier film having a dispersion and release effect.

A high-temperature-resistant anti-oxidation layer is provided between the conductor layer and the peelable carrier film, wherein the material and the thickness range of the high-temperature-resistant anti-oxidation layer are one of the following three modes:

a. the thickness of the high-temperature-resistant anti-oxidation layer is valued from 0.01 to 5 µm; the material of the high-temperature-resistant anti-oxidation layer is one of metal material, ferrite, graphite, carbon nanotube, graphene and silver paste, the metal material is one of these metal elements: aluminum, titanium, zinc, iron, nickel, chromium, cobalt, copper, silver, gold and molybdenum, or an alloy formed by at least two of these metal elements;

b. the high-temperature-resistant anti-oxidation layer is made of an adhesive, and the adhesive is at least one of a modified epoxy resin, modified acrylic acid, modified rubber, modified thermoplastic polyimide, and a modified polyurethane resin; and the thickness is valued from 0.1 to 2 μm; and c. the high-temperature-resistant anti-oxidation layer is made of a mixture of an adhesive and a conductive particle, the volume ratio of the conductive particle to the adhesive is valued from 5% to 80%, and the thickness is valued from 0.1 to 5 μm.

A shielding circuit board including the free grounding film is formed in a manner that an electromagnetic wave shielding film is arranged on a printed circuit board, and the surface of the electromagnetic wave shielding film is provided with the free grounding film.

In a grounding method of the circuit board, the electromagnetic wave shielding film includes a shielding layer and an insulating layer provided on the shielding layer, wherein the method adopts one of the following three modes for grounding:

a. the surface of the conductor layer is flat, the total thickness of the conductor layer is valued from 0.01 to 35 μm, and the adhesive film layer is a layer made of a mixture of a conductive particle and an adhesive and having a thickness of 0.2-20 μm, in the adhesive film layer, the volume ratio of the conductive particle to the adhesive is valued from 2% to 80%, and the particle size of the conductive particle is valued from 0.1 to 15 μm; the grounding mode corresponding to this structure is as follows: the conductive particle in the adhesive film layer is agglomerated into a larger conductive particle, and the larger conductive particle is used to pierce the insulating layer of the electromagnetic wave shielding film to connect with the shielding layer;

b. at least on the conductor layer adjacent to the adhesive film layer, the surface of the conductor layer in contact with the adhesive film layer is rough, the roughness is valued from 0.3 to 10 μm, the total thickness of the conductor layer is valued from 0.01 to 35 μm, the adhesive film layer is a layer made of an adhesive and having a thickness of 0.2-10 μm, and the grounding mode corresponding to this structure is as follows: the insulating layer of the shielding film is pierced by the rough surface of the conductor layer so as to the conductor layer is connected to the shielding layer;

c. at least on the conductor layer adjacent to the adhesive film layer, the surface of the conductor layer in contact with the adhesive film layer is rough, the roughness is valued from 0.3 to 10 μm, the total thickness of the conductor layer is valued from 0.01 to 35 μm, the adhesive film layer is a layer made of a mixture of an adhesive and a conductive particle and having a thickness of 0.2-20 μm, in the layer made of the mixture of an adhesive and a conductive particle, the volume ratio of the conductive particle to the adhesive is valued from 2% to 80%, the particle size of the conductive particle is valued from 0.1 to 15 μm, and the grounding mode corresponding to this structure is as follows: the conductive particle in the adhesive film layer is agglomerated into a large particle conductive particle, and the large particle conductive particle cooperates with the rough surface of the conductor layer to pierce the insulating layer of the shielding film and is connected with the shielding layer.

In a manufacturing method for the free grounding film, manufacturing steps are as follows:

1) a conductive high-temperature-resistant anti-oxidation layer is formed on one side of the peelable metal foil carrier tape;

2) at least one conductor layer is formed on the other side of the high-temperature-resistant anti-oxidation layer; and 3) an adhesive film layer is formed on the conductor layer.

In a manufacturing method for the free grounding film, manufacturing steps are as follows:

1) a resin-based high-temperature oxidation-resistant layer is formed on one side of a polyester carrier film having a dispersion and release effect;

2) at least one conductor layer is formed on the other side of the high-temperature-resistant anti-oxidation layer; and 3) the adhesive film layer is formed on the conductor layer.

The embodiments of the disclosure have the advantageous effects that by means of the free grounding film of the embodiments of the disclosure, the conventional shield grounding manner is changed, the product reliability can be greatly improved, and the cost is reduced.

Specifically:

the adhesive film layer contains conductive particles, the conductive particles are freely agglomerated into a certain size, can pierce the insulating layer of the shielding film, and achieve grounding; the adhesive film layer may not contain conductive particles, pierce the insulation layer of the shielding film through the rough surface of the conductor layer, and can also add a small amount of conductive particles, achieving the grounding, thus significantly improving the product reliability, reducing the costs. The free grounding film is pressed and fit on the shielding circuit board so that the shielding film is connected with the conductor layer of the free grounding film to achieve arbitrarily grounding. The conventional shield grounding manner is changed, the related processes of opening a window of the covering film and controlling the amount of adhesive overflow of the covering film are eliminated, and the shielding effect is ensured. At the same time, the tiny space of the circuit board can be fully utilized. All the stratums of circuit boards are designed with signal lines, increasing the line density, achieving miniaturization and multi-functionalization of circuit boards.

DETAILED DESCRIPTION OF THE EMBODIMENTS

A free grounding film includes at least one conductor layer.

One side of the conductor layer is an adhesive film layer and the other side is a peelable carrier film.

The surface of the conductor layer is flat, the total thickness of the conductor layer is valued from 0.01 to 35 μm (preferably from 0.1 to 10 μm); the adhesive film layer is a layer made of a mixture of a conductive particle and an adhesive and having a thickness of 0.2-20 μm (preferably from 0.5 to 10 μm), in the adhesive film layer, the volume ratio of the conductive particle to the adhesive is valued from 2% to 80% (preferably from 5% to 80%), and the particle size of the conductive particle is valued from 0.1 to 15 μm;

or at least on the conductor layer adjacent to the adhesive film layer, the surface of the conductor layer in contact with the adhesive film layer is rough, the roughness is valued from 0.3 to 10 μm (preferably the roughness is valued from 0.3 to 8 μm); the total thickness of the conductor layer is valued from 0.01 to 35 μm (preferably from 0.1 to 10 μm), the adhesive film layer is a layer made of an adhesive and having a thickness of 0.2-10 μm (preferably from 0.5 to 10 μm) or a layer made of a mixture of an adhesive and a conductive particle and having a thickness of 0.2-20 μm (preferably from 0.5 to 10 μm), in the layer made of the mixture of an adhesive and a conductive particle, the volume ratio of the conductive particle to the adhesive is valued from 2% to 80% (preferably from 5% to 80%), and the particle size of the conductive particle is valued from 0.1 to 15 μm.

The material of the conductor layer is at least one of metal material, ferrite, graphite, carbon nanotube and graphene, the metal material is at least one of aluminum, titanium, zinc, iron, nickel, chromium, cobalt, copper, silver, gold and molybdenum, or an alloy formed by at least two of the above listed metal elements; and the adhesive is at least one of a modified epoxy resin, modified acrylic acid, modified rubber, modified thermoplastic polyimide, and a modified polyurethane resin.

The peelable carrier film is a peelable metal foil carrier tape or is a polyester carrier film having a dispersion and release effect.

The manufacturing method for the peelable metal foil carrier tape is as follows:

1) the metal foil substrate is subjected to surface treatment, so that the surface tension is 40-90 dyne;
2) a vacuum plating is formed on one side of the substrate; and
3) the surface of the vacuum plating is subjected to brightening treatment to form a surface metal brightening layer.

A high-temperature-resistant anti-oxidation layer is provided between the conductor layer and the peelable carrier film.

The thickness range, material and forming manner of the high-temperature-resistant anti-oxidation layer are one of the following three modes:

a. the thickness of the high-temperature-resistant anti-oxidation layer is valued from 0.01 to 5 μm, preferably from 0.1 to 1 μm; the material of the high-temperature-resistant anti-oxidation layer 2 is one of metal material, ferrite, graphite, carbon nanotube, graphene and silver paste, the metal material is one of these metal elements: aluminum, titanium, zinc, iron, nickel, chromium, cobalt, copper, silver, gold and molybdenum, or an alloy formed by at least two of these metal elements; a high-temperature-resistant anti-oxidation layer is formed on the layer of the peelable carrier film in the form of one of electroless plating, PVD, CVD, vapor deposition, sputter plating, electroplating or a composite process of at least two of the above processes;

b. the high-temperature-resistant anti-oxidation layer is made of an adhesive, and the adhesive is at least one of a modified epoxy resin, modified acrylic acid, modified rubber, modified thermoplastic polyimide, and a modified polyurethane resin; and the thickness is valued from 0.1 to 2 μm; and c. the high-temperature-resistant anti-oxidation layer is made of a mixture of an adhesive and a conductive particle, the volume ratio of the conductive particle to the adhesive is valued from 5% to 80%, and the thickness is valued from 0.1 to 5 μm.

For b and c, a high-temperature-resistant anti-oxidation layer formed on the peelable carrier film layer can be cured after being coated.

A shielding circuit board including the free grounding film is formed in a manner that an electromagnetic wave shielding film is arranged on a printed circuit board, and the surface of the electromagnetic wave shielding film is provided with the free grounding film.

In a grounding method of the circuit board, the electromagnetic wave shielding film includes a shielding layer and an insulating layer provided on the shielding layer, wherein the method adopts one of the following three modes for grounding:

a. the surface of the conductor layer is flat, the total thickness of the conductor layer is valued from 0.01 to 35 μm (preferably from 0.1 to 10 μm), and the adhesive film layer is a layer made of a mixture of a conductive particle and an adhesive and having a thickness of 0.2-20 μm (preferably from 0.5 to 10 μm), in the adhesive film layer, the volume ratio of the conductive particle to the adhesive is valued from 2% to 80% (preferably from 5% to 80%), and the particle size of the conductive particle is valued from 0.1 to 15 μm; the grounding mode is as follows: the conductive particle in the adhesive film layer is agglomerated into a larger conductive particle, and the larger conductive particle is used to pierce the insulating layer of the electromagnetic wave shielding film and is connected with the shielding layer;

b. at least on the conductor layer adjacent to the adhesive film layer, the surface of the conductor layer in contact with the adhesive film layer is rough, the roughness is valued from 0.3 to 10 μm (preferably the roughness is valued from 0.3 to 8 μm), the total thickness of the conductor layer is valued from 0.01 to 35 μm (preferably from 0.1 to 10 μm), the adhesive film layer is a layer made of an adhesive and having a thickness of 0.2-10 μm (preferably from 0.5 to 10 μm), and the grounding mode is as follows: the insulating layer of the shielding film is pierced by the rough surface of the conductor layer so that the conductor layer is connected to the shielding layer;

c. at least on the conductor layer adjacent to the adhesive film layer, the surface of the conductor layer in contact with the adhesive film layer is rough, the roughness is valued from 0.3 to 10 μm (preferably the roughness is valued from 0.3 to 8 μm), the total thickness of the conductor layer is valued from 0.01 to 35 μm (preferably from 0.1 to 10 μm), the adhesive film layer is a layer made of a mixture of an adhesive and a conductive particle and having a thickness of 0.2-20 μm (preferably from 0.5 to 10 μm), in the layer made of the mixture of an adhesive and a conductive particle, the volume ratio of the conductive particle to the adhesive is valued from 2% to 80%, the particle size of the conductive particle is valued from 0.1 to 15 μm, and the grounding mode is as follows: the conductive particle in the adhesive film layer is agglomerated into a large particle conductive particle, and the large particle conductive particle cooperates with the rough surface of the conductor layer to pierce the insulating layer of the shielding film and is connected with the shielding layer.

The lower limit of the thickness of the insulating layer of the electromagnetic wave shielding film is 0.2 μm, and the upper limit is 15 μm, preferably 3 to 10 μm, and further preferably, for the above three different grounding modes, the upper limit of the thickness can be matched and satisfied. That is, for a, the conductive particle in the adhesive film layer is agglomerated into a large conductive particle, and the upper limit of the thickness can satisfy the fact that the large particle of the conductive particle pierces the insulating layer alone and is connected with the shielding layer so as to achieve grounding; for b, the conductor layer rough surface pierces the insulating layer alone so as to achieve grounding, and the upper limit of the thickness can satisfy the fact that the conductor layer rough surface pierces the insulating layer alone and is connected with the shielding layer so as to achieve grounding; and for c, the conductive particle in the adhesive film layer is agglomerated into a large conductive particle, and the upper limit of the thickness can satisfy the fact that the rough surface of the conductor layer cooperates with the large particle conductive particle to pierce the insulating layer and is connected with the shielding layer so as to achieve grounding.

The electromagnetic wave shielding film according to the embodiments of the disclosure is a product in the traditional art, including an insulating layer and a conductor layer that are interconnected, as described in Patent Application No. 201410016769.2, entitled as Electromagnetic Wave Shielding Film And Electromagnetic Wave Shielding Film Introduced In The Manufacturing Method Of Circuit Board Including Shielding Film or in Patent Application No. 201420022753.8, entitled as Structure Of Electromagnetic Shielding Film Used For Printed Circuit Board And Shielding Film Described In Printed Circuit Board Containing Shielding Film.

A manufacturing method for the free grounding film has manufacturing steps as follows:

1) a conductive high-temperature-resistant anti-oxidation layer is formed on one side of the peelable metal foil carrier tape;

2) at least one conductor layer is formed on the other side of the high-temperature-resistant anti-oxidation layer; and 3) an adhesive film layer is formed on the conductor layer.

A manufacturing method for the free grounding film has manufacturing steps as follows:

1) a resin-based high-temperature oxidation-resistant layer is formed on one side of a polyester carrier film having a dispersion and release effect;

2) at least one conductor layer is formed on the other side of the high-temperature-resistant anti-oxidation layer; and 3) the adhesive film layer is formed on the conductor layer.

The embodiments of the disclosure will now be further described with reference to specific embodiments thereof.

Embodiment 1

Figure 1:
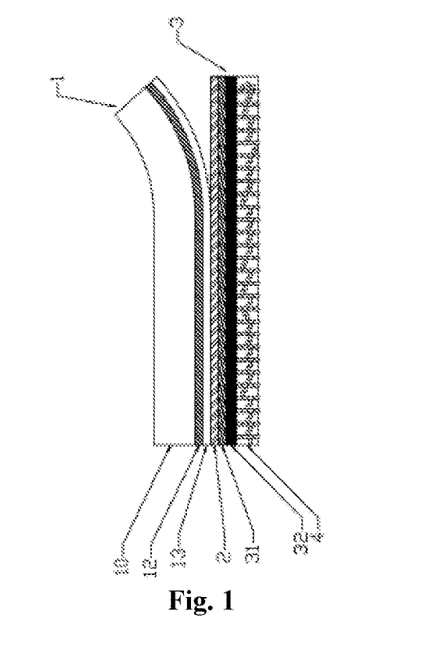
FIG. 1 is a structure schematic diagram of a free grounding film according to the embodiments of the disclosure.

As shown in FIG. 1, for a free grounding film, the high-temperature-resistant anti-oxidation layer 2 is provided on one side of the peelable carrier film 1 and a conductor layer 3 is provided on the other side of the high-temperature-resistant anti-oxidation layer 2. The conductor layer 3 is formed by a conductor layer 31 and a conductor layer 32. An adhesive film layer 4 is provided on the other side of the conductor layer 32, and the adhesive film layer 4 contains conductive particles; the peelable carrier film 1 is formed by a metal foil substrate 10, a vacuum plating layer 12, and a metal brightening layer 13.

The manufacturing method for the peelable carrier film is as follows:

1) the metal foil substrate is subjected to surface treatment, so that the surface tension is 40-90 dyne;

2) a vacuum plating is formed on one side of the substrate; and 3) the surface of the vacuum plating is subjected to brightening treatment to form a surface metal brightening layer.

A manufacturing method for the free grounding film has the following specific steps of manufacturing:

1) the high-temperature-resistant anti-oxidation layer 2 is formed on one side of the peelable carrier film 1 (i.e., a high-temperature-resistant anti-oxidation layer is formed on the metal brightening layer of the carrier film), wherein the thickness of the high-temperature-resistant anti-oxidation layer is valued from 0.01 to 5 μm, preferably from 0.1 to 1 μm; the material of the high-temperature-resistant anti-oxidation layer 2 is one of metal material, ferrite, graphite, carbon nanotube, graphene and silver paste, the metal material is one of these metal elements: aluminum, titanium, zinc, iron, nickel, chromium, cobalt, copper, silver, gold and molybdenum, or an alloy formed by at least two of these metal elements; the high-temperature-resistant anti-oxidation layer 2 is formed in the form of one of electroless plating, PVD, CVD, vapor deposition, sputter plating, electroplating or a composite process of at least two of the above processes;

2) the conductor layer 31 is formed on the other side of the high-temperature-resistant anti-oxidation layer 2; wherein the thickness of the conductor layer 31 is valued from 0.01 to 1 μm, preferably from 0.1 to 1 μm; the material used for the conductor layer 31 is at least one of metal material, ferrite, graphite, carbon nanotube, and graphene, the metal material is one of these metal elements: aluminum, titanium, zinc, iron, nickel, chromium, cobalt, copper, silver, gold and molybdenum, or an alloy formed by at least two of these metal elements; the conductor layer 31 is formed in the form of one of electroless plating, PVD, CVD, vapor deposition, sputter plating, electroplating or a composite process of at least two of the above processes;

3) the conductor layer 32 is formed on the surface of the conductor layer 31; wherein the thickness of the conductor layer is valued from 0.01 to 35 μm, preferably from 0.5 to 10 μm; the material used for the conductor layer 32 is at least one of metal material, ferrite, graphite, carbon nanotube, and graphene, the metal material is one of these metal elements: aluminum, titanium, zinc, iron, nickel, chromium, cobalt, copper, silver, gold and molybdenum, or an alloy formed by at least two of these metal elements; the conductor layer 32 is formed in the form of one of electroless plating, PVD, CVD, vapor deposition, sputter plating, electroplating or a composite process of at least two of the above processes; and 4) an adhesive film layer 4 is formed on the surface of the conductor layer 32; wherein the adhesive film layer 4 is made of a mixture of an adhesive and a conductive particle (the manufacturing method is a common knowledge, for example, being cured after being coated) and has a thickness of 0.2-20 µm, preferably from 0.5 to 10 µm; the adhesive used for the adhesive film layer 4 is at least one of a modified epoxy resin, modified acrylic acid, modified rubber, modified thermoplastic polyimide, and a modified polyurethane resin; the conductive particle is at least one of the following particles which can be agglomerated into a larger size: carbon, silver, nickel, copper, nickel gold, copper nickel, and copper nickel gold, the particle size of the conductive particle is valued from 0.1 to 15 µm, preferably from 0.2 to 10 µm, and the volume ratio of the conductive particle to the adhesive is valued from 2% to 80%, preferably from 5% to 80%.

Embodiment 2

Figure 2:
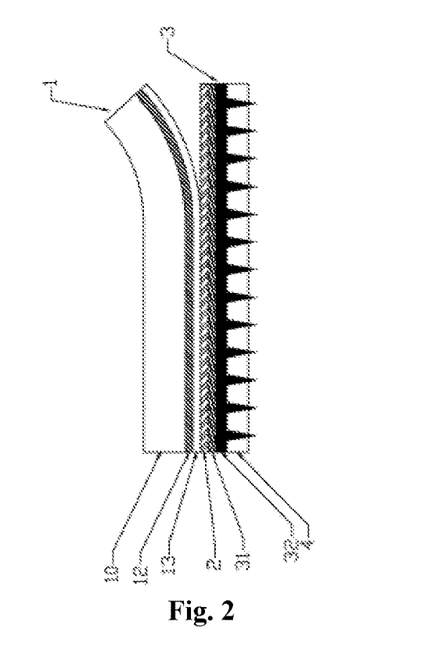
FIG. 2 is a structure schematic diagram of a free grounding film according to the embodiments of the disclosure.

As shown in FIG. 2, for a free grounding film, the high-temperature-resistant anti-oxidation layer 2 is provided on one side of the peelable carrier film 1 and a conductor layer 3 is provided on the other side of the high-temperature-resistant anti-oxidation layer 2. The conductor layer 3 is formed by a conductor layer 31 and a conductor layer 32. An adhesive film layer 4 (the adhesive film layer contains no conductive particles) is provided on the other side of the conductor layer 32; the peelable carrier film 1 is formed by a metal foil substrate 10, a vacuum plating layer 12, and a metal brightening layer 13.

The manufacturing method for the peelable carrier film is as follows:

1) the metal foil substrate is subjected to surface treatment, so that the surface tension is 40-90 dyne;

2) a vacuum plating is formed on one side of the substrate; and 3) the surface of the vacuum plating is subjected to brightening treatment to form a surface metal brightening layer.

A manufacturing method for the free grounding film has the following specific steps of manufacturing:

1) the high-temperature-resistant anti-oxidation layer 2 is formed on one side of the peelable carrier film 1 (i.e., a high-temperature-resistant anti-oxidation layer is formed on the metal brightening layer of the carrier film), wherein the thickness of the high-temperature-resistant anti-oxidation layer is valued from 0.01 to 5 µm, preferably from 0.1 to 1 µm; the material of the high-temperature-resistant anti-oxidation layer 2 is one of metal material, ferrite, graphite, carbon nanotube, graphene and silver paste, the metal material is one of these metal elements: aluminum, titanium, zinc, iron, nickel, chromium, cobalt, copper, silver, gold and molybdenum, or an alloy formed by at least two of these metal elements; the high-temperature-resistant anti-oxidation layer 2 is formed in the form of one of electroless plating, PVD, CVD, vapor deposition, sputter plating, electroplating or a composite process of at least two of the above processes;

2) the conductor layer 31 is formed on the other side of the high-temperature-resistant anti-oxidation layer 2; wherein the thickness of the conductor layer 31 is valued from 0.01 to 1 µm, preferably from 0.1 to 1 µm; the material used for the conductor layer 31 is at least one of metal material, ferrite, graphite, carbon nanotube, and graphene, the metal material is one of these metal elements: aluminum, titanium, zinc, iron, nickel, chromium, cobalt, copper, silver, gold and molybdenum, or an alloy formed by at least two of these metal elements; the conductor layer 31 is formed in the form of one of electroless plating, PVD, CVD, vapor deposition, sputter plating, electroplating or a composite process of at least two of the above processes;

3) the conductor layer 32 is formed on the surface of the conductor layer 31; wherein the thickness of the conductor layer 32 is valued from 0.01 to 35 µm, preferably from 0.1 to 10 µm; the material used for the conductor layer 32 is at least one of metal material, ferrite, graphite, carbon nanotube, and graphene, the metal material is one of these metal elements: aluminum, titanium, zinc, iron, nickel, chromium, cobalt, copper, silver, gold and molybdenum, or an alloy formed by at least two of these metal elements; the conductor layer 32 is formed in the form of one of electroless plating, PVD, CVD, vapor deposition, sputter plating, electroplating or a composite process of at least two of the above processes;

4) the surface of the conductor layer 32 is roughened: a roughening method of the circuit board copper foil is used to first roughen, then cure and then passivate one surface of the conductor layer 32, and the roughening plating solution includes alkali copper and acid copper plating solution; or a micro-etching method of the circuit board is used to first roughen and then passivate one surface of the conductor layer 32; the conductor layer 32 has a surface roughness of 0.3 to 10 µm, preferably 0.3-8 µm. The micro-etching solution is one of: sulfuric acid-hydrogen peroxide type etching solution, sodium persulfate etching solution, copper chloride etching solution, iron chloride etching solution, alkaline etching solution of copper ammonium chloride-ammonia water system, and organic alkaline etching solution; and 5) an adhesive film layer 4 is formed on the surface of the conductor layer 32; wherein the adhesive film layer 4 is a pure adhesive and has a thickness of 0.2-10 µm, preferably from 0.5 to 10 µm; the adhesive used for the adhesive film layer 4 is at least one of a modified epoxy resin, modified acrylic acid, modified rubber, modified thermoplastic polyimide, and a modified polyurethane resin.

Embodiment 3

Figure 3:
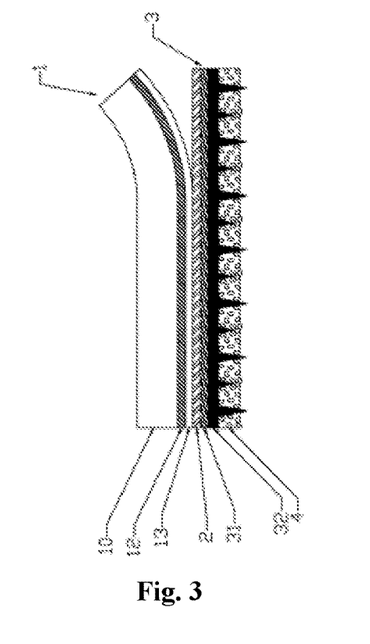
FIG. 3 is a structure schematic diagram of a free grounding film according to the embodiments of the disclosure.

As shown in FIG. 3, for a free grounding film, the high-temperature-resistant anti-oxidation layer 2 is provided on one side of the peelable carrier film 1 and a conductor layer 3 is provided on the other side of the high-temperature-resistant anti-oxidation layer 2. The conductor layer 3 is formed by a conductor layer 31 and a conductor layer 32. An adhesive film layer 4 is provided on the other side of the conductor layer 32, and the adhesive film layer 4 contains conductive particles; the peelable carrier film 1 is formed by a metal foil substrate 10, a vacuum plating layer 12, and a metal brightening layer 13.

The manufacturing method for the peelable carrier film is as follows:

1) the metal foil substrate is subjected to surface treatment, so that the surface tension is 40-90 dyne;

2) a vacuum plating is formed on one side of the substrate; and 3) the surface of the vacuum plating is subjected to brightening treatment to form a surface metal brightening layer.

A manufacturing method for the free grounding film has the following specific steps of manufacturing:

1) the high-temperature-resistant anti-oxidation layer 2 is formed on one side of the peelable carrier film 1 (i.e., a high-temperature-resistant anti-oxidation layer is formed on the metal brightening layer of the carrier film), wherein the thickness of the high-temperature-resistant anti-oxidation layer is valued from 0.01 to 5 μm, preferably from 0.1 to 1 μm; the material of the high-temperature-resistant anti-oxidation layer 2 is one of metal material, ferrite, graphite, carbon nanotube, graphene and silver paste, the metal material is one of these metal elements: aluminum, titanium, zinc, iron, nickel, chromium, cobalt, copper, silver, gold and molybdenum, or an alloy formed by at least two of these metal elements; the high-temperature-resistant anti-oxidation layer 2 is formed in the form of one of electroless plating, PVD, CVD, vapor deposition, sputter plating, electroplating or a composite process of at least two of the above processes;

2) the conductor layer 31 is formed on the other side of the high-temperature-resistant anti-oxidation layer 2; wherein the thickness of the conductor layer 31 is valued from 0.01 to 1 μm, preferably from 0.1 to 1 μm; the material used for the conductor layer 31 is at least one of metal material, ferrite, graphite, carbon nanotube, and graphene, the metal material is one of these metal elements: aluminum, titanium, zinc, iron, nickel, chromium, cobalt, copper, silver, gold and molybdenum, or an alloy formed by at least two of these metal elements; the conductor layer 31 is formed in the form of one of electroless plating, PVD, CVD, vapor deposition, sputter plating, electroplating or a composite process of at least two of the above processes;

3) the conductor layer 32 is formed on the surface of the conductor layer 31; wherein the thickness of the conductor layer 32 is valued from 0.01 to 35 μm, preferably from 0.1 to 10 μm; the material used for the conductor layer 32 is at least one of metal material, ferrite, graphite, carbon nanotube, and graphene, the metal material is one of these metal elements: aluminum, titanium, zinc, iron, nickel, chromium, cobalt, copper, silver, gold and molybdenum, or an alloy formed by at least two of these metal elements; the conductor layer 32 is formed in the form of one of electroless plating, PVD, CVD, vapor deposition, sputter plating, electroplating or a composite process of at least two of the above processes;

4) the surface of the conductor layer 32 is roughened: a roughening method of the circuit board copper foil is used to first roughen, then cure and then passivate one surface of the conductor layer 32, and the roughening plating solution includes alkali copper and acid copper plating solution; or a micro-etching method of the circuit board is used to first roughen and then passivate one surface of the conductor layer 32; the conductor layer 32 has a surface roughness of 0.3 to 10 μm, preferably 0.3-8 μm. The micro-etching solution is one of: sulfuric acid-hydrogen peroxide type etching solution, sodium persulfate etching solution, copper chloride etching solution, iron chloride etching solution, alkaline etching solution of copper ammonium chloride-ammonia water system, and organic alkaline etching solution; and 5) an adhesive film layer 4 is formed on the surface of the conductor layer 32; wherein the adhesive film layer 4 is made of a mixture of an adhesive and a conductive particle and has a thickness of 0.2-20 μm, preferably from 0.5 to 10 μm; the adhesive used for the adhesive film layer 4 is at least one of a modified epoxy resin, modified acrylic acid, modified rubber, modified thermoplastic polyimide, and a modified polyurethane resin; the conductive particle is at least one of the following particles which can be agglomerated into a larger size: carbon, silver, nickel, copper, nickel gold, copper nickel, and copper nickel gold, the particle size of the conductive particle is valued from 0.1 to 15 μm, preferably from 0.2 to 10 μm, and the volume ratio of the conductive particle to the adhesive is valued from 2% to 80%, preferably from 5% to 80%.

In the above Embodiments 1 to 3, the peelable carrier film 1 may also be a film layer formed on the surface of the substrate 10 and having a roughness of 0.3 to 7 μm, and then the vacuum plating layer 12 and the metal brightening layer 13 are formed layer by layer so that the metal brightening layer 13 of the peelable carrier film 1 also has a certain degree of roughness, and the high temperature oxidation preventing layer 2 and the conductor layer 3 are successively formed on the surface of the metal brightening layer 13 so that the conductor layer 3 has a certain roughness before roughening to strengthen the piercing effect. The thin film layer having a roughness of 0.3-7 μm includes a resin and a filler, changes the roughness of the film layer by the filler, and finally changes the roughness of the conductor layer 3 to enhance the effect of piercing. The resin is at least one of a modified epoxy resin, modified acrylic acid, modified rubber, modified thermoplastic polyimide, and a modified polyurethane resin, and the filler is silicon dioxide, aluminum hydroxide, calcium carbonate, titanium dioxide, aluminum oxide, magnesium hydroxide, mica powder, silica powder, talc, and kaolin; the volume ratio of the filler to the resin is 10% to 80%.

Embodiment 4

Figure 4:
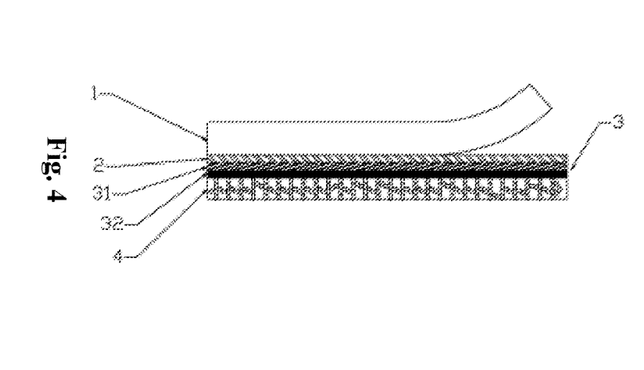
FIG. 4 is a structure schematic diagram of a free grounding film according to the embodiments of the disclosure.

As shown in FIG. 4, for a free grounding film, the high-temperature-resistant anti-oxidation layer 2 is provided on one side of the peelable carrier film 1 and a conductor layer 3 is provided on the other side of the high-temperature-resistant anti-oxidation layer 2. The conductor layer 3 is formed by a conductor layer 31 and a conductor layer 32. An adhesive film layer 4 is provided on the other side of the conductor layer 32, and the adhesive film layer 4 contains conductive particles; the peelable carrier film is a polyester film having a dispersion and release effect.

A manufacturing method for the free grounding film has the following specific steps of manufacturing:

1) the high-temperature-resistant anti-oxidation layer 2 is formed on one side of the peelable carrier film 1, wherein the thickness of the high-temperature-resistant anti-oxidation layer is valued from 0.01 to 5 μm; the high-temperature-resistant anti-oxidation layer 2 is made of an adhesive or a mixture of an adhesive and a conductive particle; the adhesive is at least one of a modified epoxy resin, modified acrylic acid, modified rubber, modified thermoplastic polyimide, and a modified polyurethane resin; the conductive particle is at least one of carbon, silver, nickel, copper, nickel gold, copper nickel, and copper nickel gold; when the high-temperature-resistant anti-oxidation layer 2 is made of an adhesive, the thickness is preferably from 0.1 to 2 μm; when the high-temperature-resistant anti-oxidation layer 2 is made of a mixture of an adhesive and a conductive particle, the volume ratio of the conductive particle to the adhesive is valued from 5% to 80%, and the thickness is preferably from 0.1 to 5 μm;

2) the conductor layer 31 is formed on the other side of the high-temperature-resistant anti-oxidation layer 2; wherein the thickness of the conductor layer 31 is valued from 0.01 to 1 μm, preferably from 0.1 to 1 μm; the material used for the conductor layer 31 is at least one of metal material, ferrite, graphite, carbon nanotube, and graphene, the metal material is one of these metal elements: aluminum, titanium, zinc, iron, nickel, chromium, cobalt, copper, silver, gold and molybdenum, or an alloy formed by at least two of these metal elements; the conductor layer 31 is formed in the form of one of electroless plating, PVD, CVD, vapor deposition, sputter plating, electroplating or a composite process of at least two of the above processes;

3) the conductor layer 32 is formed on the surface of the conductor layer 31; wherein the thickness of the conductor layer 32 is valued from 0.01 to 35 μm, preferably from 0.1 to 10 μm; the material used for the conductor layer 32 is at least one of metal material, ferrite, graphite, carbon nanotube, and graphene, the metal material is one of these metal elements: aluminum, titanium, zinc, iron, nickel, chromium, cobalt, copper, silver, gold and molybdenum, or an alloy formed by at least two of these metal elements; the conductor layer 32 is formed in the form of one of electroless plating, PVD, CVD, vapor deposition, sputter plating, electroplating or a composite process of at least two of the above processes; and 4) an adhesive film layer 4 is formed on the surface of the conductor layer 32; wherein the adhesive film layer 4 is made of a mixture of an adhesive and a conductive particle and has a thickness of 0.2-20 μm, preferably from 0.5 to 10 μm; the adhesive used for the adhesive film layer 4 is at least one of a modified epoxy resin, modified acrylic acid, modified rubber, modified thermoplastic polyimide, and a modified polyurethane resin; the conductive particle is at least one of the following particles which can be agglomerated into a larger size: carbon, silver, nickel, copper, nickel gold, copper nickel, and copper nickel gold, the particle size of the conductive particle is valued from 0.1 to 15 μm, preferably from 0.2 to 10 μm, and the volume ratio of the conductive particle to the adhesive is valued from 2% to 80%, preferably from 5% to 80%.

Embodiment 5

Figure 5:
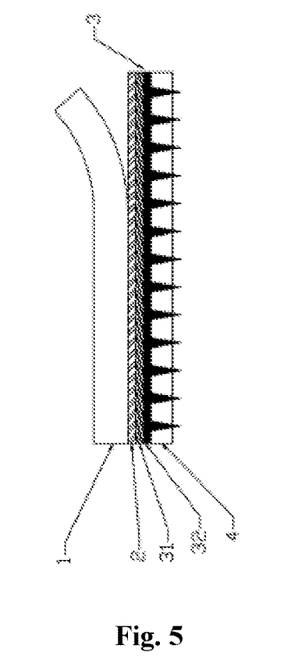
FIG. 5 is a structure schematic diagram of a free grounding film according to the embodiments of the disclosure.

As shown in FIG. 5, for a free grounding film, the high-temperature-resistant anti-oxidation layer 2 is provided on one side of the peelable carrier film 1 and a conductor layer 3 is provided on the other side of the high-temperature-resistant anti-oxidation layer 2. The conductor layer 3 is formed by a conductor layer 31 and a conductor layer 32. An adhesive film layer 4 is provided on the other side of the conductor layer 32, and the adhesive film layer 4 contains no conductive particles; the peelable carrier film is a polyester film having a dispersion and release effect.

A manufacturing method for the free grounding film has the following specific steps of manufacturing:

1) the high-temperature-resistant anti-oxidation layer 2 is formed on one side of the peelable carrier film 1, wherein the thickness of the high-temperature-resistant anti-oxidation layer is valued from 0.01 to 5 μm; the high-temperature-resistant anti-oxidation layer 2 is made of an adhesive or a mixture of an adhesive and a conductive particle; the adhesive is at least one of a modified epoxy resin, modified acrylic acid, modified rubber, modified thermoplastic polyimide, and a modified polyurethane resin; the conductive particle is at least one of carbon, silver, nickel, copper, nickel gold, copper nickel, and copper nickel gold; when the high-temperature-resistant anti-oxidation layer 2 is made of an adhesive, the thickness is preferably from 0.1 to 2 μm; when the high-temperature-resistant anti-oxidation layer 2 is made of a mixture of an adhesive and a conductive particle, the volume ratio of the conductive particle to the adhesive is valued from 5% to 80%, and the thickness is preferably from 0.1 to 5 μm;

2) the conductor layer 31 is formed on the other side of the high-temperature-resistant anti-oxidation layer 2; wherein the thickness of the conductor layer 31 is valued from 0.01 to 1 μm, preferably from 0.1 to 1 μm; the material used for the conductor layer 31 is at least one of metal material, ferrite, graphite, carbon nanotube, and graphene, the metal material is one of these metal elements: aluminum, titanium, zinc, iron, nickel, chromium, cobalt, copper, silver, gold and molybdenum, or an alloy formed by at least two of these metal elements; the conductor layer 31 is formed in the form of one of electroless plating, PVD, CVD, vapor deposition, sputter plating, electroplating or a composite process of at least two of the above processes;

3) the conductor layer 32 is formed on the surface of the conductor layer 31; wherein the thickness of the conductor layer 32 is valued from 0.01 to 35 μm, preferably from 0.1 to 10 μm; the material used for the conductor layer 32 is at least one of metal material, ferrite, graphite, carbon nanotube, and graphene, the metal material is one of these metal elements: aluminum, titanium, zinc, iron, nickel, chromium, cobalt, copper, silver, gold and molybdenum, or an alloy formed by at least two of these metal elements; the conductor layer 32 is formed in the form of one of electroless plating, PVD, CVD, vapor deposition, sputter plating, electroplating or a composite process of at least two of the above processes;

4) the surface of the conductor layer 32 is roughened: a roughening method of the circuit board copper foil is used to first roughen, then cure and then passivate one surface of the conductor layer 32, and the roughening plating solution includes alkali copper and acid copper plating solution; or a micro-etching method of the circuit board is used to first roughen and then passivate one surface of the conductor layer 32; the conductor layer 32 has a surface roughness of 0.3 to 10 μm, preferably 0.3-8 μm. The micro-etching solution is one of: sulfuric acid-hydrogen peroxide type etching solution, sodium persulfate etching solution, copper chloride etching solution, iron chloride etching solution, alkaline etching solution of copper ammonium chloride-ammonia water system, and organic alkaline etching solution; and 5) an adhesive film layer 4 is formed on the surface of the conductor layer 32; wherein the adhesive film layer 4 is made of an adhesive and has a thickness of 0.2-10 μm, preferably from 0.5 to 10 μm; the adhesive used for the adhesive film layer 4 is at least one of a modified epoxy resin, modified acrylic acid, modified rubber, modified thermoplastic polyimide, and a modified polyurethane resin.

Embodiment 6

Figure 6:
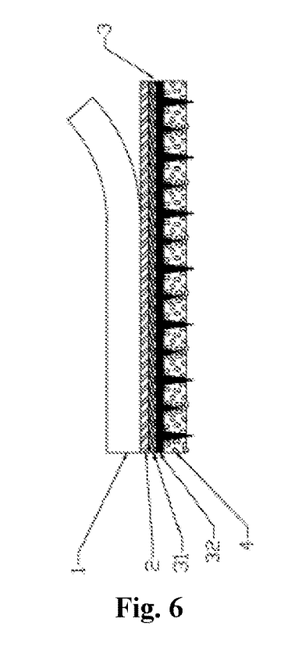
FIG. 6 is a structure schematic diagram of a free grounding film according to the embodiments of the disclosure.

As shown in FIG. 6, for a free grounding film, the high-temperature-resistant anti-oxidation layer 2 is provided on one side of the peelable carrier film 1 and a conductor layer 3 is provided on the other side of the high-temperature-resistant anti-oxidation layer 2. The conductor layer 3 is formed by a conductor layer 31 and a conductor layer 32. An adhesive film layer 4 is provided on the other side of the conductor layer 32, and the adhesive film layer 4 contains conductive particles; the peelable carrier film is a polyester film having a release and dispersion effect.

A manufacturing method for the free grounding film has the following specific steps of manufacturing:

1) the high-temperature-resistant anti-oxidation layer 2 is formed on one side of the peelable carrier film 1, wherein the thickness of the high-temperature-resistant anti-oxidation layer is valued from 0.01 to 5 µm; the high-temperature-resistant anti-oxidation layer 2 is made of an adhesive or a mixture of an adhesive and a conductive particle; the adhesive is at least one of a modified epoxy resin, modified acrylic acid, modified rubber, modified thermoplastic polyimide, and a modified polyurethane resin; the conductive particle is at least one of carbon, silver, nickel, copper, nickel gold, copper nickel, and copper nickel gold; when the high-temperature-resistant anti-oxidation layer 2 is made of an adhesive, the thickness is preferably from 0.1 to 2 µm; when the high-temperature-resistant anti-oxidation layer 2 is made of a mixture of an adhesive and a conductive particle, the volume ratio of the conductive particle to the adhesive is valued from 5% to 80%, and the thickness is preferably from 0.1 to 5 µm;

2) the conductor layer 31 is formed on the other side of the high-temperature-resistant anti-oxidation layer 2; wherein the thickness of the conductor layer 31 is valued from 0.01 to 1 µm, preferably from 0.1 to 1 µm; the material used for the conductor layer 31 is at least one of metal material, ferrite, graphite, carbon nanotube, and graphene, the metal material is one of these metal elements: aluminum, titanium, zinc, iron, nickel, chromium, cobalt, copper, silver, gold and molybdenum, or an alloy formed by at least two of these metal elements; the conductor layer 31 is formed in the form of one of electroless plating, PVD, CVD, vapor deposition, sputter plating, electroplating or a composite process of at least two of the above processes;

3) the conductor layer 32 is formed on the surface of the conductor layer 31; wherein the thickness of the conductor layer 32 is valued from 0.01 to 35 µm, preferably from 0.1 to 10 µm; the material used for the conductor layer 32 is at least one of metal material, ferrite, graphite, carbon nanotube, and graphene, the metal material is one of these metal elements: aluminum, titanium, zinc, iron, nickel, chromium, cobalt, copper, silver, gold and molybdenum, or an alloy formed by at least two of these metal elements; the conductor layer 32 is formed in the form of one of electroless plating, PVD, CVD, vapor deposition, sputter plating, electroplating or a composite process of at least two of the above processes;

4) the surface of the conductor layer 32 is roughened: a roughening method of the circuit board copper foil is used to first roughen, then cure and then passivate one surface of the conductor layer 32, and the roughening plating solution includes alkali copper and acid copper plating solution; or a micro-etching method of the circuit board is used to first roughen and then passivate one surface of the conductor layer 32; the conductor layer 32 has a surface roughness of 0.3 to 10 µm, preferably 0.3-8 µm. The micro-etching solution is one of: sulfuric acid-hydrogen peroxide type etching solution, sodium persulfate etching solution, copper chloride etching solution, iron chloride etching solution, alkaline etching solution of copper ammonium chloride-ammonia water system, and organic alkaline etching solution; and 5) an adhesive film layer 4 is formed on the surface of the conductor layer 32; wherein the adhesive film layer 4 is made of a mixture of an adhesive and a conductive particle and has a thickness of 0.2-20 µm, preferably from 0.5 to 10 µm; the adhesive used for the adhesive film layer 4 is at least one of a modified epoxy resin, modified acrylic acid, modified rubber, modified thermoplastic polyimide, and a modified polyurethane resin; the conductive particle is at least one of the following particles which can be agglomerated into a larger size: carbon, silver, nickel, copper, nickel gold, copper nickel, and copper nickel gold, the particle size of the conductive particle is valued from 0.1 to 15 µm, preferably from 0.2 to 10 µm, and the volume ratio of the conductive particle to the adhesive is valued from 2% to 80%, preferably from 5% to 80%.

Embodiment 7

Figure 7:
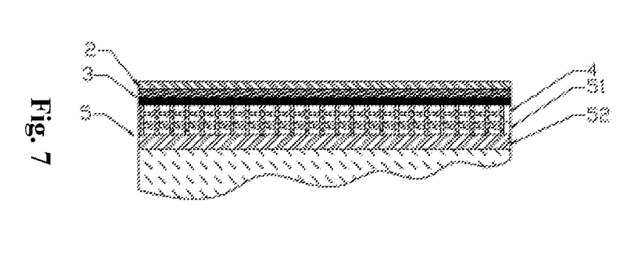
FIG. 7 is a structure schematic diagram of a shielding circuit board including a free grounding film according to the embodiments of the disclosure.

As shown in FIG. 7, in a shielding circuit board using a free grounding film as in the structure of Embodiments 1 or 4, the free grounding film is closely connected to a circuit board including a shielding film 5 in a thickness direction, the shielding film 5 includes an insulating layer 51 and a shielding layer 52, and the free grounding film conductor layer 3 (the high temperature oxidation preventing layer 2 on the conductive layer) is directly connected to the shielding layer 52 of the shielding film through the conductive particles in the adhesive film layer 4.

Correspondingly, a grounding method of a shielding circuit board including a free grounding film includes the following steps:

1) the free grounding film and the shielding circuit board prepared by the method in Embodiment 1 or Embodiment 4 are thermocompression-cured in the thickness direction, and then are cured at 160° C. for 1 h after thermocompression-curing; when the adhesive used for the adhesive film layer 4 is a modified epoxy resin, the temperature and time of thermocompression-curing are: 190° C. and 90 s, and when the adhesive used for the adhesive film layer 4 is a modified acrylic acid resin, the temperature and time of thermocompression-curing are: 170° C. and 90 s; and 2) the conductive particles in the adhesive film layer 4 of the free grounding film are agglomerated into large-sized particles, pierce the insulating layer 51 of the shielding film 5, and are in contact with the shielding layer 52 of the shielding film 5 to achieve the grounding.

The adhesive layer 4 contains conductive particles, and the conductive particles are freely agglomerated to form large-sized particles, pierce the insulating layer 51 of the shielding film 5, and are in contact with the shielding layer 52 of the shielding film 5 to achieve the grounding, thereby reducing the difficulty in designing the raw material and increasing the degree of freedom of selecting the raw material (without limiting the particle size and the particle size distribution of the conductive particles).

Embodiment 8

Figure 8:
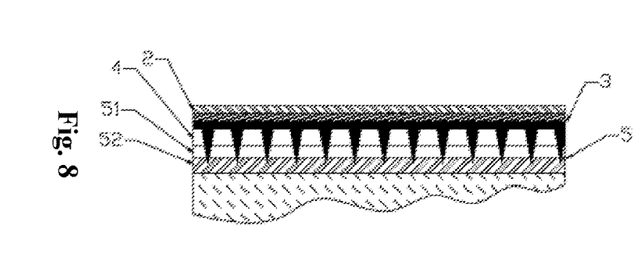
FIG. 8 is a structure schematic diagram of a shielding circuit board including a free grounding film according to the embodiments of the disclosure.

As shown in FIG. 8, in a shielding circuit board using a free grounding film as in the structure of Embodiments 2 or 5, the free grounding film is closely connected to a circuit board including a shielding film 5 in a thickness direction, the shielding film 5 includes an insulating layer 51 and a shielding layer 52, and the free grounding film conductor layer 3 (the high temperature oxidation preventing layer 2 on the conductive layer) is directly connected to the shielding layer 52 of the shielding film through the rough surface of the conductor layer 3.

Correspondingly, a grounding method of a shielding circuit board including a free grounding film includes the following steps:

1) the free grounding film and the shielding circuit board prepared by the method in Embodiment 2 or Embodiment 5 are thermocompression-cured in the thickness direction, and then are cured at 160° C. for 1 h after thermocompression-curing; when the adhesive used for the adhesive film layer 4 is a modified epoxy resin, the temperature and time of thermocompression-curing are: 190° C. and 90 s, and when the adhesive used for the adhesive film layer 4 is a modified acrylic acid resin, the temperature and time of thermocompression-curing are: 170° C. and 90 s; and 2) a part of the rough surface of the conductor layer 3 of the free grounding film pierces the insulating layer 51 of the shielding film 5, and is in contact with the shielding layer 52 of the shielding film 5 to achieve the grounding.

The adhesive layer 4 contains no conductive particles, pierces the insulating layer 51 of the shielding film 5 with the rough surface of the conductor layer 3, and is in contact with the shielding layer 52 of the shielding film 5 to achieve the grounding, thereby improving the product grounding reliability (avoiding the unevenness of the particle size of the conductive particles), reducing the difficulty in designing the raw material (without controlling the particle size of the conductive particles), and significantly reducing the cost.

Embodiment 9

Figure 9:
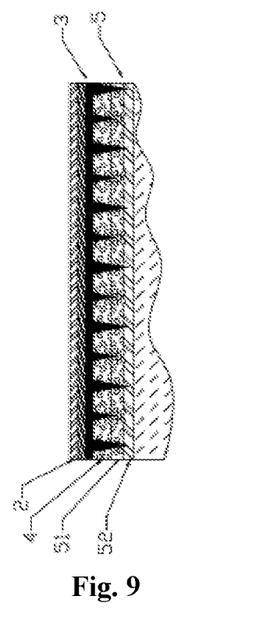
FIG. 9 is a structure schematic diagram of a shielding circuit board including a free grounding film according to the embodiments of the disclosure.

As shown in FIG. 9, in a shielding circuit board using a free grounding film as in the structure of Embodiments 3 or 6, the free grounding film is closely connected to a circuit board including a shielding film 5 in a thickness direction, the shielding film 5 includes an insulating layer 51 and a shielding layer 52, and the free grounding film conductor layer 3 (the high temperature oxidation preventing layer 2 on the conductive layer) is in contact with the shielding layer 52 of the shielding film through the combined action of the conductive particles in the adhesive film layer 4 and the rough surface of the conductor layer 3.

Correspondingly, a grounding method of a shielding circuit board including a free grounding film includes the following steps:

1) the free grounding film and the shielding circuit board prepared by the method in Embodiment 3 or Embodiment 6 are thermocompression-cured in the thickness direction, and then are cured at 160° C. for 1 h after thermocompression-curing; when the adhesive used for the adhesive film layer 4 is a modified epoxy resin, the temperature and time of thermocompression-curing are: 190° C. and 90 s, and when the adhesive used for the adhesive film layer 4 is a modified acrylic acid resin, the temperature and time of thermocompression-curing are: 170° C. and 90 s; and 2) the rough surface of the conductor layer 3 of the free grounding film and the conductive particles in the adhesive film layer 4 pierce the insulating layer 51 of the shielding film 5 together, and are in contact with the shielding layer 52 of the shielding film 5 to achieve the grounding.

The adhesive layer 4 contains a few conductive particles, pierces the insulating layer 51 of the shielding film 5 with the rough surface of the conductor layer 3 of the free grounding film and the conductive particles in the adhesive film layer 4, and is in contact with the shielding layer 52 of the shielding film 5 to achieve the grounding, thereby further ensuring the product grounding reliability (avoiding the unevenness of the particle size of the conductive particles), reducing the grounding resistance, and reducing the difficulty in designing the raw material (without deliberately selecting the conductive particles of a larger particle size).

What is claimed is:

1. A free grounding film comprising:
at least one conductor layer,
wherein one side of the conductor layer is an adhesive film layer and the other side is a peelable carrier film, wherein a high-temperature-resistant anti-oxidation layer is set between the conductor layer and the peelable carrier film, and
wherein a material and a thickness range of the high-temperature-resistant anti-oxidation layer comprises one of the following three modes:
a. a thickness of the high-temperature-resistant anti-oxidation layer is valued from 0.01 to 5 μm; the material of the high-temperature-resistant anti-oxidation layer comprises one of metal material, ferrite, graphite, carbon nanotube, graphene and silver paste, the metal material comprises one of these metal elements: aluminum, titanium, zinc, iron, nickel, chromium, cobalt, copper, silver, gold and molybdenum, or an alloy formed by at least two of the metal elements;
b. the high-temperature-resistant anti-oxidation layer is made of an adhesive, and the adhesive comprises at least one of a modified epoxy resin, modified acrylic acid, modified rubber, modified thermoplastic polyimide, and a modified polyurethane resin; and a thickness of the high-temperature-resistant anti-oxidation layer is valued from 0.1 to 2 μm; and
c. the high-temperature-resistant anti-oxidation layer is made of a mixture of an adhesive and a conductive particle, a volume ratio of the conductive particle to the adhesive is valued from 5% to 80%, and a thickness of the high-temperature-resistant anti-oxidation layer is valued from 0.1 to 5 μm.

2. The free grounding film as claimed in claim 1, wherein a surface of the conductor layer is flat, a total thickness of the conductor layer is valued from 0.01 to 35 μm, and the adhesive film layer is a layer made of a mixture of a conductive particle and an adhesive and having a thickness valued from 0.2 to 20 μm, in the adhesive film layer, a volume ratio of the conductive particle to the adhesive is valued from 2% to 80%, and a particle size of the conductive particle is valued from 0.1 to 15 μm, or at least on the conductor layer adjacent to the adhesive film layer, a surface of the conductor layer in contact with the adhesive film layer is rough, a roughness is valued from 0.3 to 10 μm, a total thickness of the conductor layer is valued from 0.01 to 35 μm, the adhesive film layer is a layer made of an adhesive and having a thickness valued from 0.2-10 μm, or the adhesive film layer is a layer made of a mixture of an adhesive and a conductive particle and having a thickness of 0.2-20 μm, in the layer made of the mixture of the adhesive and the conductive particle, a volume ratio of the conductive particle to the adhesive is valued from 2% to 80%, and a particle size of the conductive particle is valued from 0.1 to 15 μm.

3. The free grounding film as claimed in claim 1, wherein a material of the conductor layer comprises at least one of metal material, ferrite, graphite, carbon nanotube and graphene, the metal material comprises at least one of aluminum, titanium, zinc, iron, nickel, chromium, cobalt, copper, silver, gold and molybdenum, or metal material is an alloy formed by at least two of the above listed metal elements; and the adhesive comprises at least one of a modified epoxy resin, modified acrylic acid, modified rubber, modified thermoplastic polyimide, and a modified polyurethane resin.

4. The free grounding film as claimed in claim 1, wherein the peelable carrier film comprises a peelable metal foil carrier tape or a polyester carrier film having a dispersion and release effect.

5. A shielding circuit board comprising a free grounding film, comprising a printed circuit board having an electromagnetic wave shielding film, and a surface of the electromagnetic wave shielding film is provided with the free grounding film as claimed in claim 1.

6. A grounding method of the shielding circuit board, wherein an electromagnetic wave shielding film includes a shielding layer and an insulating layer set on the shielding layer, wherein the grounding method comprises one of following three modes for grounding:
  a. a surface of the conductor layer is flat, a total thickness of the conductor layer is valued from 0.01 to 35 μm, and the adhesive film layer is a layer made of a mixture of a conductive particle and an adhesive and having a thickness valued from 0.2-20 μm, in the adhesive film layer, a volume ratio of the conductive particle to the adhesive is valued from 2% to 80%, and a particle size of the conductive particle is valued from 0.1 to 15 μm; a grounding mode corresponding to this structure is as follows: conductive particles in the adhesive film layer is agglomerated into a larger conductive particle, and the larger conductive particle is used to pierce the insulating layer of the electromagnetic wave shielding film to connect with the shielding layer;
  b. at least on the conductor layer adjacent to the adhesive film layer, a surface of the conductor layer in contact with the adhesive film layer is rough, a roughness is valued from 0.3 to 10 μm, a total thickness of the conductor layer is valued from 0.01 to 35 μm, the adhesive film layer is a layer made of an adhesive and having a thickness valued from 0.2 to 10 μm, and a grounding mode corresponding to this structure is as follows: an insulating layer of the shielding film is pierced by a rough surface of the conductor layer so as to the conductor layer is connected to the shielding layer; or
  c. at least on the conductor layer adjacent to the adhesive film layer, a surface of the conductor layer in contact with the adhesive film layer is rough, a roughness is valued from 0.3 to 10 μm, a total thickness of the conductor layer is valued from 0.01 to 35 μm, the adhesive film layer is a layer made of a mixture of an adhesive and a conductive particle and having a thickness valued form 0.2 to 20 μm, in the layer made of the mixture of the adhesive and the conductive particle, a volume ratio of the conductive particle to the adhesive is valued from 2% to 80%, a particle size of the conductive particle is valued from 0.1 to 15 μm, and a grounding mode corresponding to this structure is as follows: conductive particles in the adhesive film layer is agglomerated into a large particle conductive particle, and the large particle conductive particle cooperates with a rough surface of the conductor layer to pierce the insulating layer of the shielding film to connect with the shielding layer.

7. A manufacturing method for the free grounding film, wherein manufacturing steps are as follows:
  a. a conductive high-temperature-resistant anti-oxidation layer is formed on one side of a peelable metal foil carrier tape;
  b. at least one conductor layer is formed on the other side of the high-temperature-resistant anti-oxidation layer; and
  c. an adhesive film layer is formed on the conductor layer.

8. A manufacturing method for the free grounding film, wherein manufacturing steps are as follows:
  a. a resin-based high-temperature oxidation-resistant layer is formed on one side of the polyester carrier film having a dispersion and release;
  b. at least one conductor layer is formed on the other side of the high-temperature-resistant anti-oxidation layer; and
  c. an adhesive film layer is formed on the conductor layer, wherein one side of the conductor layer is an adhesive film layer and the other side is a peelable carrier film, wherein a high-temperature-resistant anti-oxidation layer is set between the conductor layer and the peelable carrier film, wherein a material and a thickness range of the high-temperature-resistant anti-oxidation layer comprises one of the following three modes:
    a. a thickness of the high-temperature-resistant anti-oxidation layer is valued from 0.01 to 5 μm; the material of the high-temperature-resistant anti-oxidation layer comprises one of metal material, ferrite, graphite, carbon nanotube, graphene and silver paste, the metal material comprises one of these metal elements: aluminum, titanium, zinc, iron, nickel, chromium, cobalt, copper, silver, gold and molybdenum, or an alloy formed by at least two of the metal elements;
    b. the high-temperature-resistant anti-oxidation layer is made of an adhesive, and the adhesive comprises at least one of a modified epoxy resin, modified acrylic acid, modified rubber, modified thermoplastic polyimide, and a modified polyurethane resin; and a thickness of the high-temperature-resistant anti-oxidation layer is valued from 0.1 to 2 μm; and
    c. the high-temperature-resistant anti-oxidation layer is made of a mixture of an adhesive and a conductive particle, a volume ratio of the conductive particle to the adhesive is valued from 5% to 80%, and a thickness of the high-temperature-resistant anti-oxidation layer is valued from 0.1 to 5 μm.

* * * * *